(12) United States Patent
Hopkins et al.

(10) Patent No.: US 12,242,909 B2
(45) Date of Patent: *Mar. 4, 2025

(54) MOUNTS FOR TRACKING DEVICES

(71) Applicant: Elevation Lab, Inc., Portland, OR (US)

(72) Inventors: Casey Hopkins, Portland, OR (US); Jacob Hull, Portland, OR (US)

(73) Assignee: Elevation Lab, Inc., Portland, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/620,657

(22) Filed: Mar. 28, 2024

(65) Prior Publication Data

US 2024/0242056 A1 Jul. 18, 2024

Related U.S. Application Data

(63) Continuation of application No. 18/316,090, filed on May 11, 2023, now Pat. No. 12,014,236, which is a continuation-in-part of application No. 17/873,654, filed on Jul. 26, 2022, now Pat. No. 11,694,058.

(51) Int. Cl.
*H01L 23/00* (2006.01)
*G06K 19/077* (2006.01)
*H01L 23/02* (2006.01)

(52) U.S. Cl.
CPC ........ *G06K 19/07745* (2013.01); *H01L 23/02* (2013.01)

(58) Field of Classification Search
CPC .......................... H01L 23/02; G06K 19/07745
USPC ........................................................ 235/492
See application file for complete search history.

(56) References Cited

U.S. PATENT DOCUMENTS

| | | | |
|---|---|---|---|
| D680,015 S | 4/2013 | Hauser et al. | |
| 2016/0247379 A1* | 8/2016 | Forbes | G08B 21/023 |
| 2017/0079336 A1* | 3/2017 | Hirschberg | A41D 1/002 |
| 2018/0325426 A1* | 11/2018 | Shaw | G16H 40/67 |
| 2022/0391656 A1 | 12/2022 | Chen et al. | |

* cited by examiner

*Primary Examiner* — Zhengfu J Feng
(74) *Attorney, Agent, or Firm* — Kolitch Romano Dascenzo Gates LLC

(57) ABSTRACT

Mounts for securing a device to a flexible object comprise a flexible substrate configured to be operatively coupled to the flexible object and a housing coupled to the flexible substrate and having an internal void that is sized to receive the device.

20 Claims, 8 Drawing Sheets

MOUNTS FOR TRACKING DEVICES

RELATED APPLICATIONS

This application is a continuation of and claims priority to U.S. patent application Ser. No. 18/316,090, filed on May 11, 2023, which is a continuation-in-part of U.S. patent application Ser. No. 17/873,654, filed on Jul. 26, 2022, and which issued as U.S. Pat. No. 11,694,058 on Jul. 4, 2023, both of which are entitled MOUNTS FOR TRACKING DEVICES, the complete disclosures of which are incorporated herein by reference.

FIELD

The present disclosure relates to mounts for tracking devices.

BACKGROUND

In recent years, wireless tracking devices have become popular. Typically, wireless tracking devices are small and require additional hardware to be physically mounted or coupled to an object desired to be tracked. Consumers often use wireless tracking devices for keys, sports equipment, pets, electronic equipment, etc. However, consumers also may wish to track soft goods, like purses and other bags, jackets and other apparel, etc.

SUMMARY

Mounts for securing a device to a flexible object are disclosed herein and comprise a flexible substrate that is configured to be operatively coupled to the flexible object and a housing that is coupled to the flexible substrate and that has an internal void that is sized to receive the device.

DESCRIPTION

Figure 1:
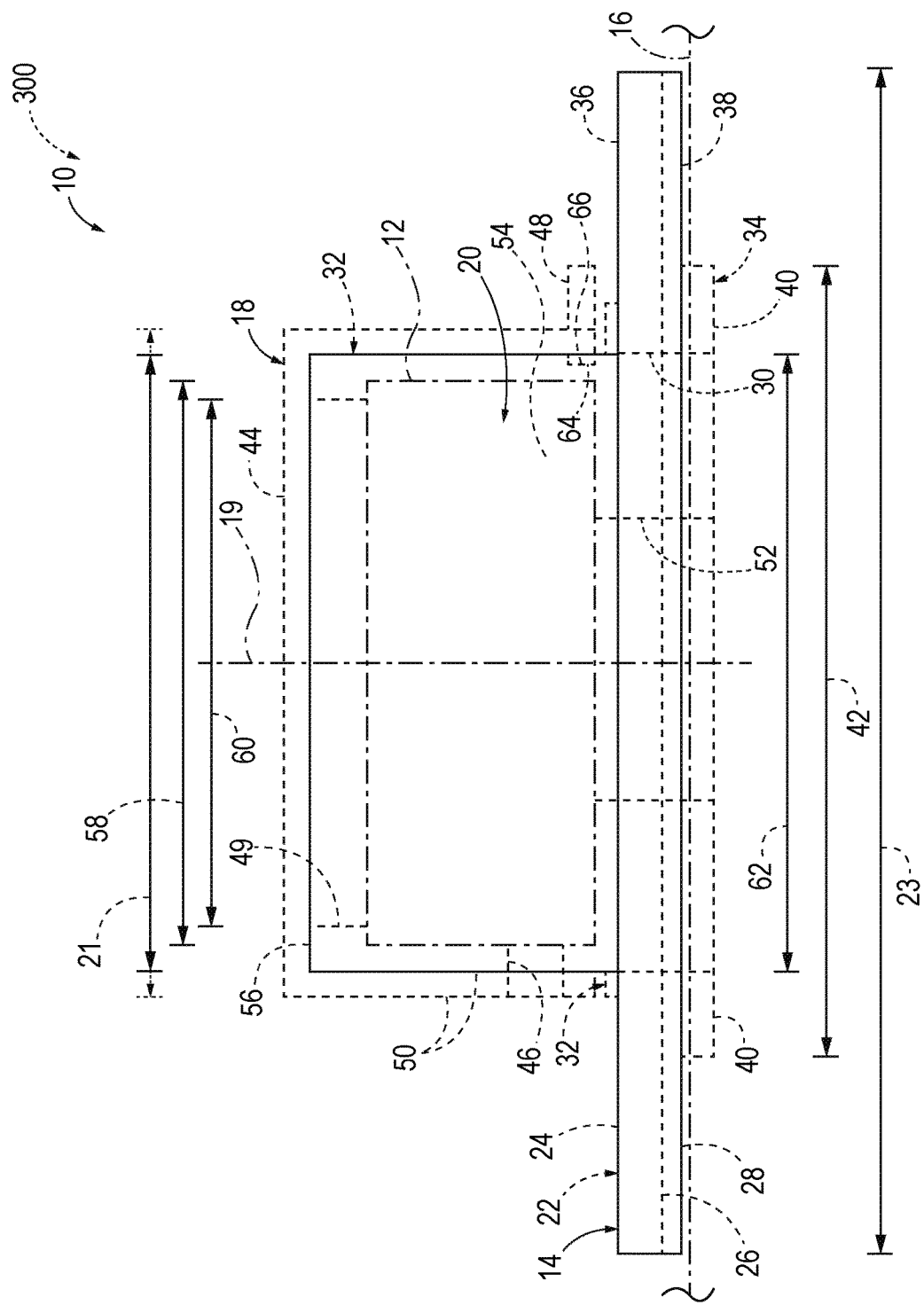
FIG. 1 is a diagram schematically representing mounts for securing devices according to the present disclosure.
Figure 2:
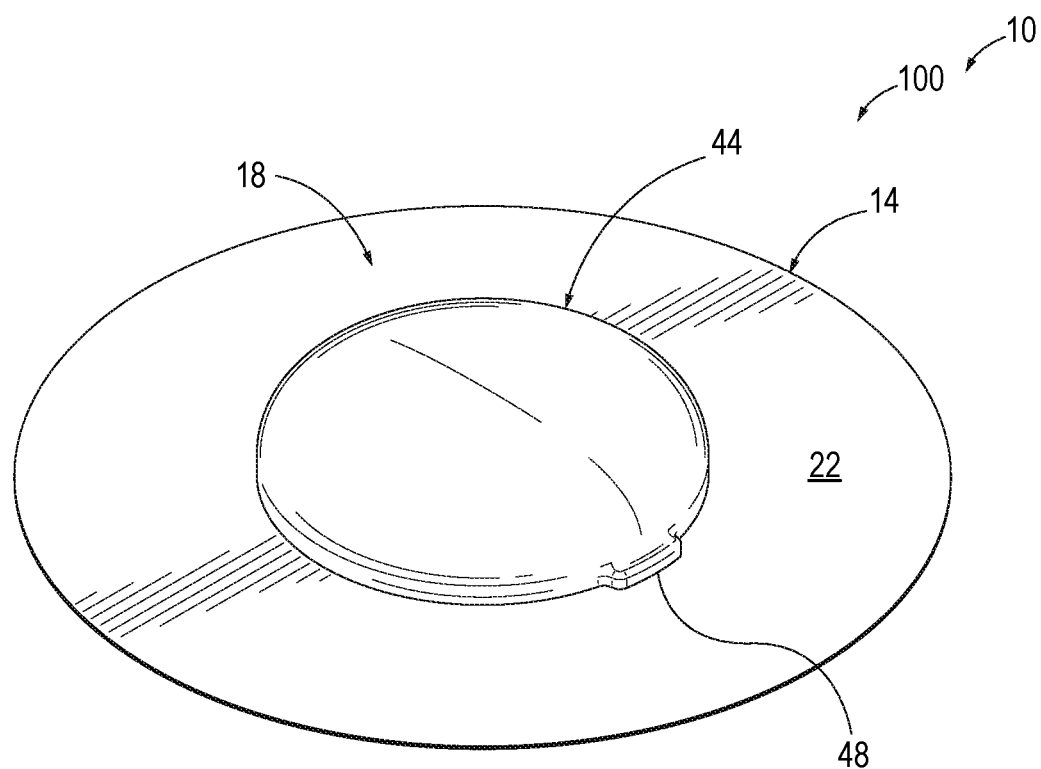
FIG. 2 is an isometric view of an example mount according to the present disclosure.
Figure 3:
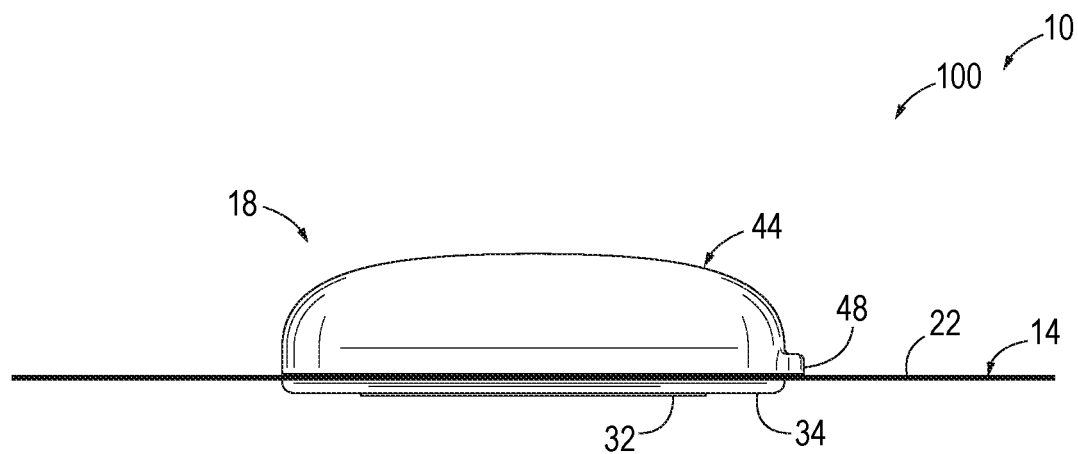
FIG. 3 is a side view of the example mount of FIG. 2.
Figure 4:
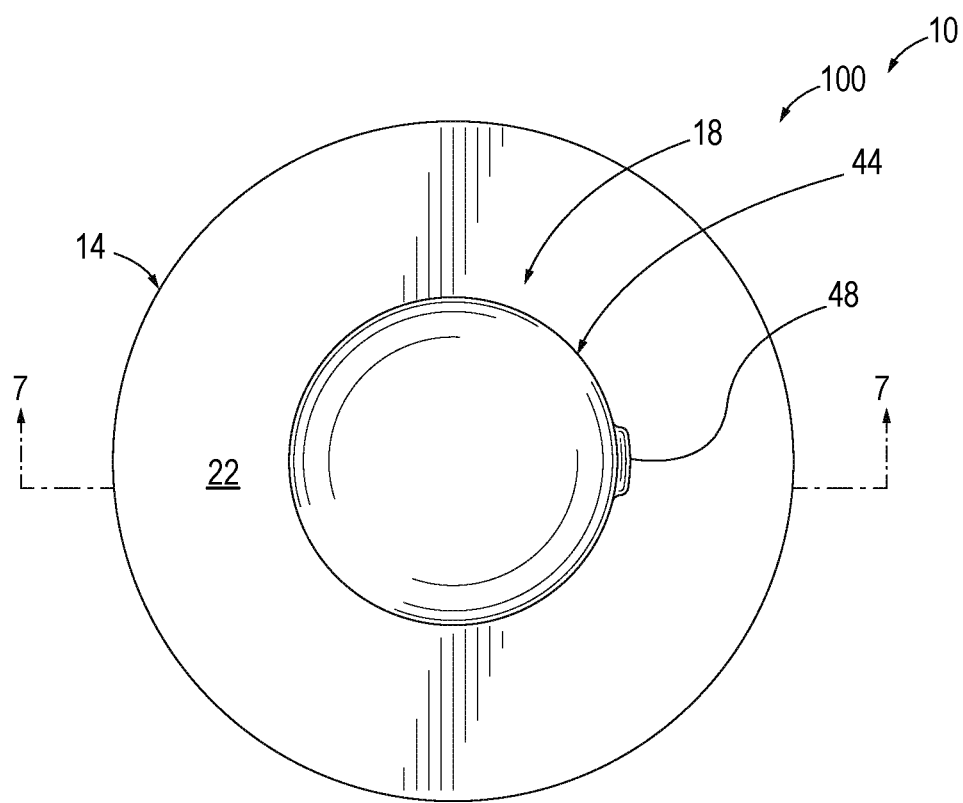
FIG. 4 is a top view of the example mount of FIG. 2.
Figure 5:
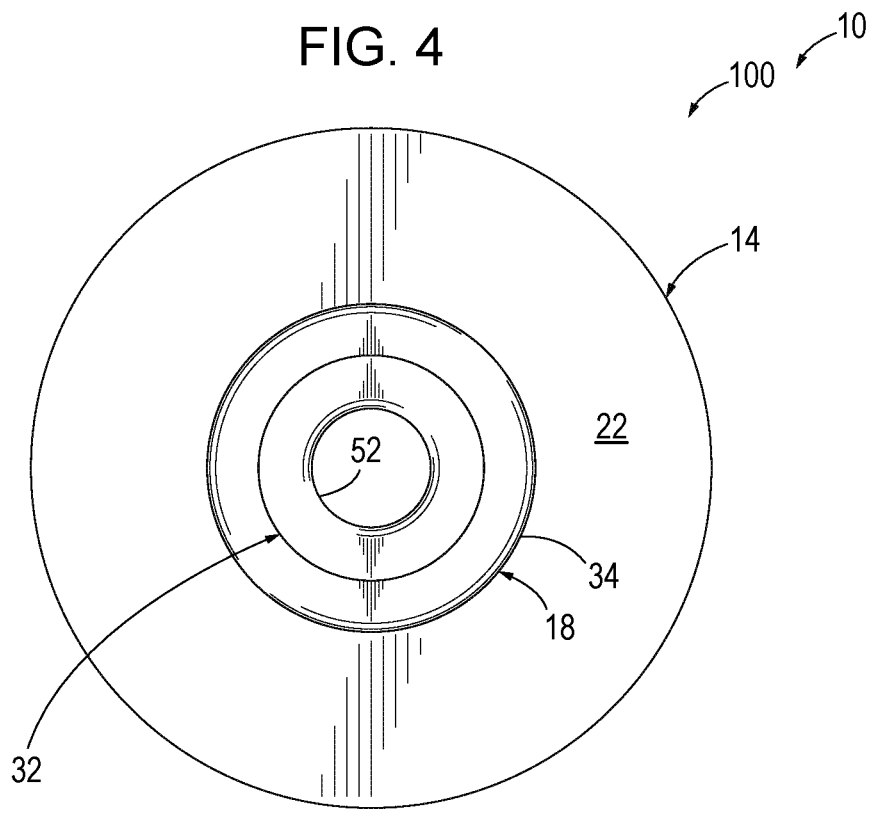
FIG. 5 is a bottom view of the example mount of FIG. 2.
Figure 6:
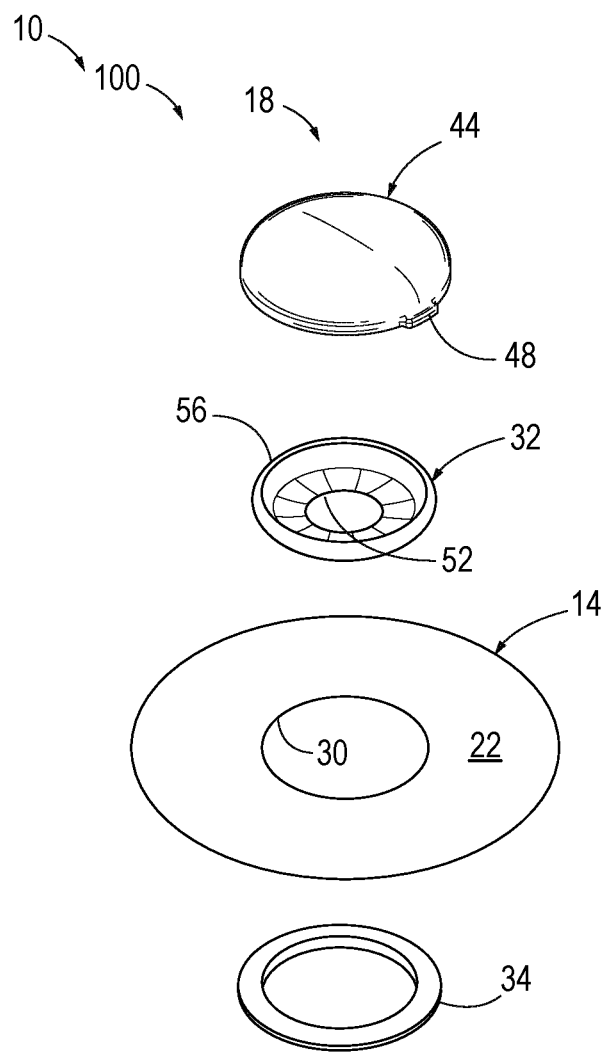
FIG. 6 is an exploded view of the example mount of FIG. 2.
Figure 7:
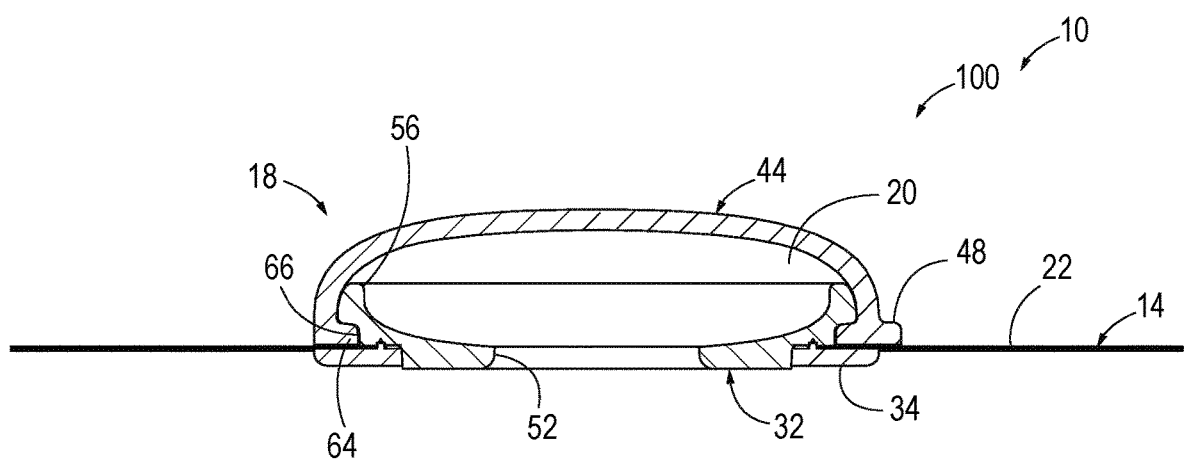
FIG. 7 is a cross-section view of the example mount of FIG. 2, taken along line 7-7 in FIG. 4.
Figure 8:
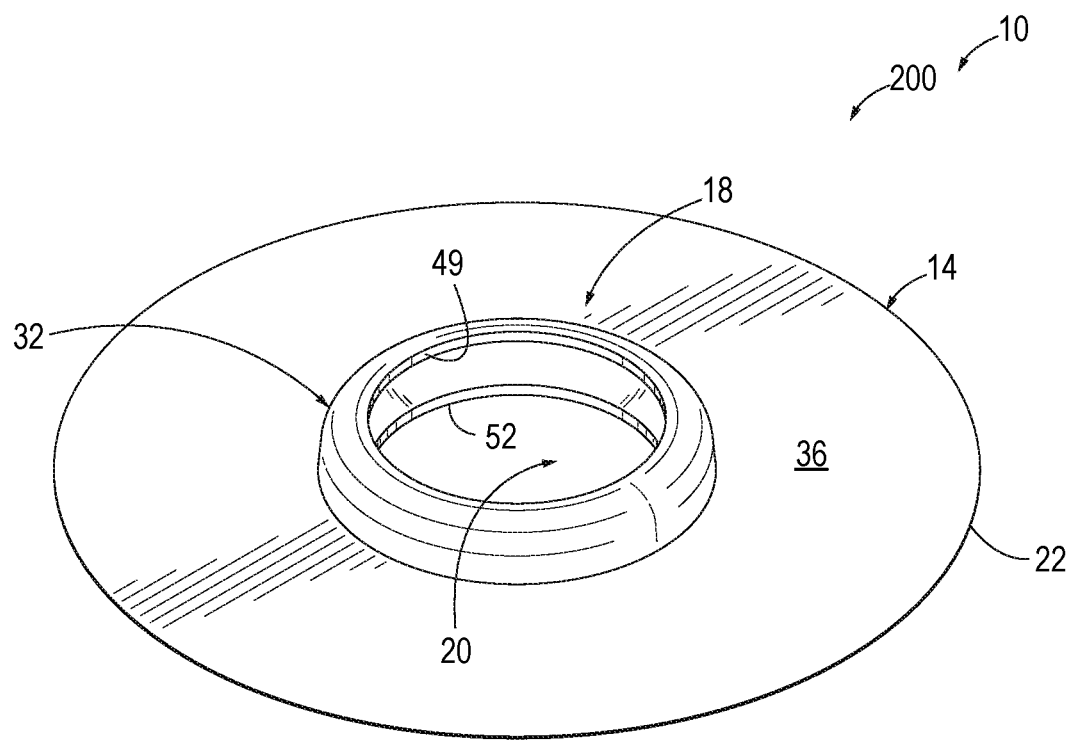
FIG. 8 is an isometric view of another example mount according to the present disclosure.
Figure 9:
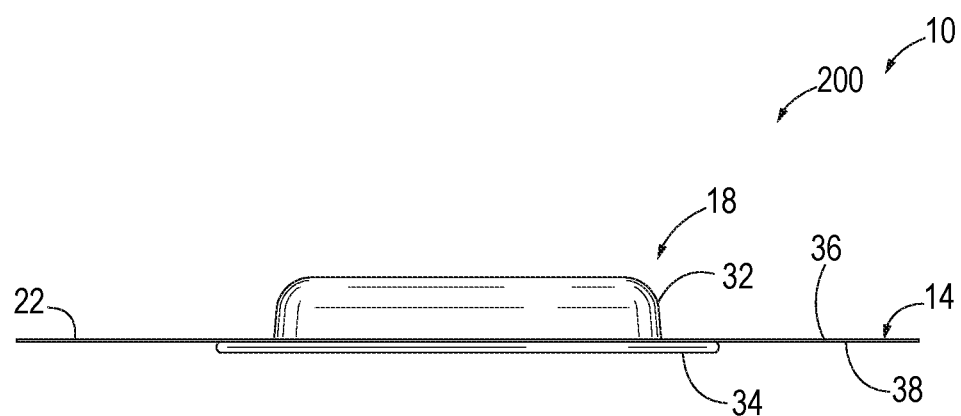
FIG. 9 is a side view of the example mount of FIG. 8.
Figure 10:
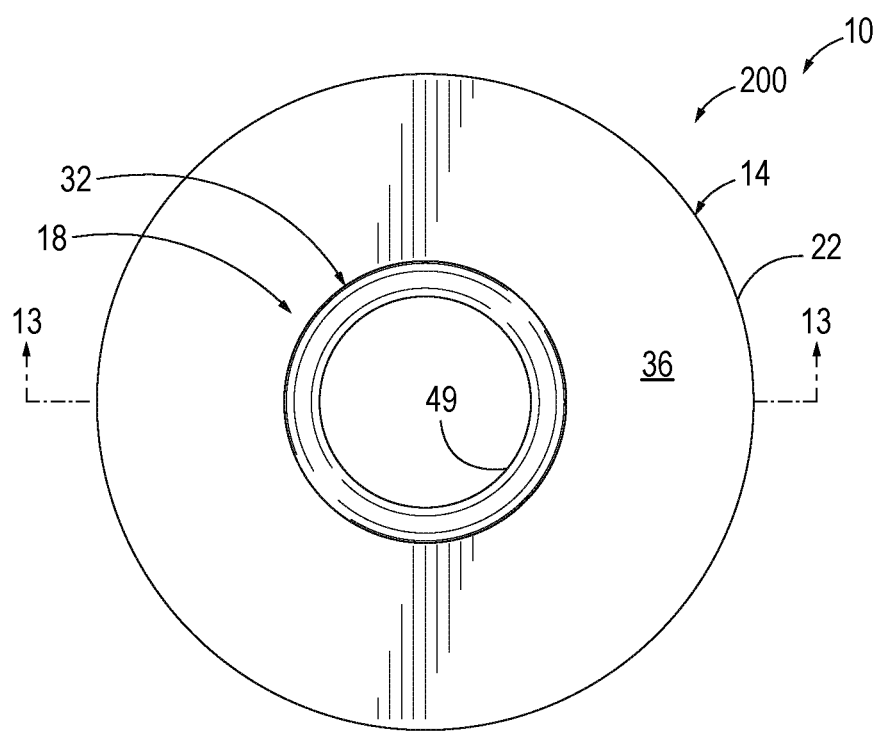
FIG. 10 is a top view of the example mount of FIG. 8.
Figure 11:
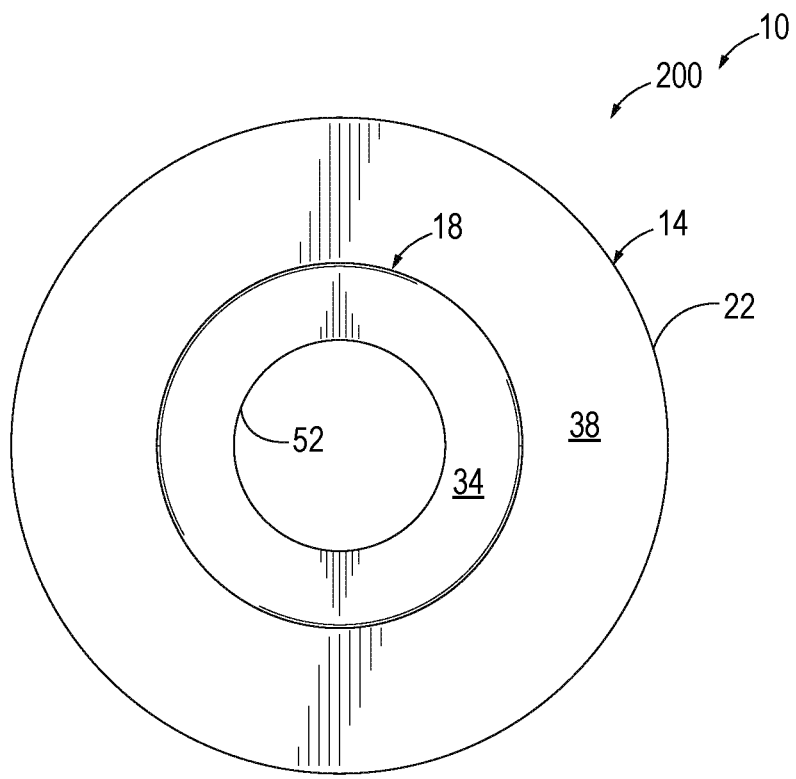
FIG. 11 is a bottom view of the example mount of FIG. 8.
Figure 12:
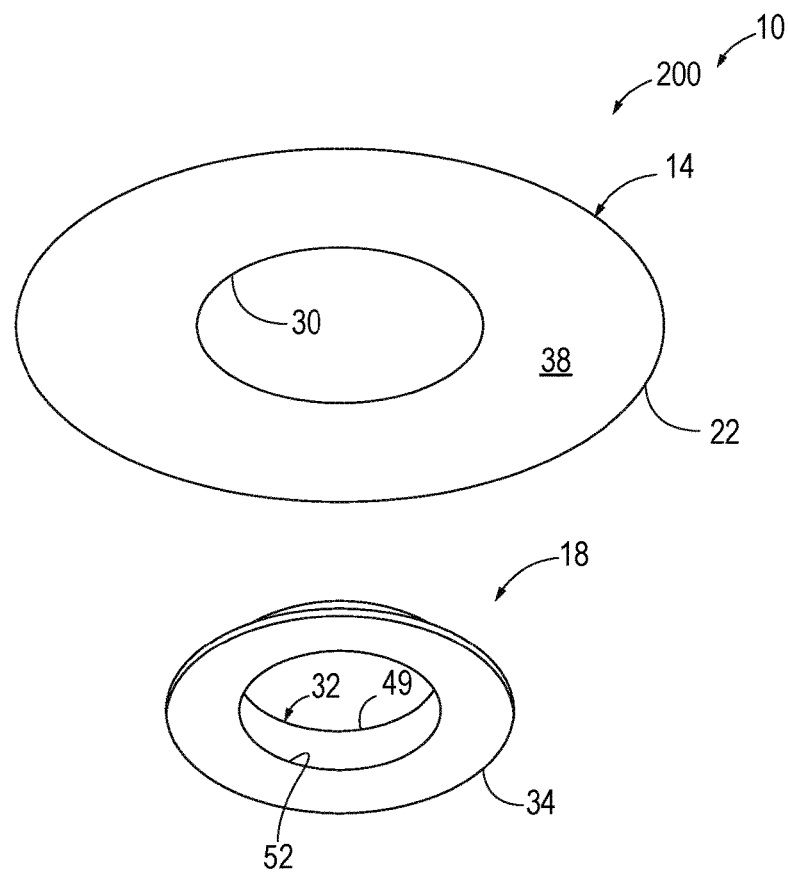
FIG. 12 is an exploded view of the example mount of FIG. 8.
Figure 13:
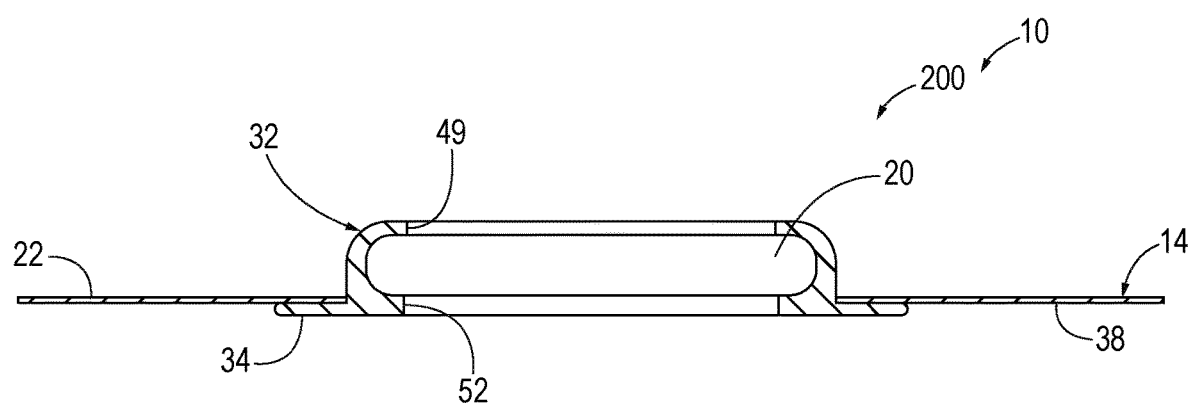
FIG. 13 is a cross-section view of the example mount of FIG. 8, taken along line 13-13 in FIG. 10.

Mounts 10 for securing devices 12 to flexible objects 16 are disclosed herein and schematically represented in FIG. 1. Generally, in FIG. 1, elements that are likely to be included in a given example are illustrated in solid lines, while elements that are optional to a given example or that correspond to a specific example are illustrated in broken lines. However, elements that are illustrated in solid lines are not essential to all examples of the present disclosure, and an element shown in solid lines may be omitted from a particular example without departing from the scope of the present disclosure.

Examples of devices 12 include wireless (e.g., WiFi, Bluetooth™, GPS) tracking devices (e.g., Apple AirTag™, Tile™, Samsung Galaxy SmartTag™, Chipolo One™, CubePro™, Orbit™, and Baseus™ branded tracking devices); and examples of flexible objects 16 include apparel, bags, backpacks, purses, blankets, etc. That said, mounts 10 are not required to be utilized exclusively with flexible objects, and mounts 10 also may be utilized with rigid objects, such as sporting goods, automobiles, computers, mobile computing devices, toys, etc. Functionally, mounts 10 maybe used to secure a tracking device to an object that a user desires to keep track of.

As schematically represented in FIG. 1, mounts 10 comprise a flexible substrate 14 that is configured to be operatively coupled to a flexible object 16, and a housing 18 that is coupled to the flexible substrate 14. The housing 18 has an internal void 20 that is sized and shaped to receive a device 12. A flexible substrate 14 is a sheet material that will conform, or at least partially conform, to a flexible object 16 when operatively coupled to the flexible object 16. The flexible substrate 14 also may be described as a flexible flat plate 14 and/or as a flexible sheet material 14. The flexible substrate 14 maybe described as having a first side 36 and a second side 38 that is opposite the first side 36. In some examples and as schematically and optionally represented in FIG. 1, the flexible substrate 14 comprises an adhesive-backed film 22 that comprises a base layer 24, an adhesive 26 adhered to the base layer 24, and a removable backing 28 that is removably adhered to the adhesive 26. The base layer 24 defines the first side 36, and the removable backing 28 maybe described as defining the second side 38 when still attached to the adhesive 26, and with the adhesive becoming the second side 38 when the removable backing 28 is removed. Accordingly, in such examples, the mount 10 maybe operatively coupled to a flexible object 16 by removing the removable backing 28 and adhering the base layer 24 to the flexible object 16 with the adhesive 26. Additionally or alternatively, the flexible substrate 14 maybe configured to be sewn to the flexible object 16. For example, the flexible substrate 14 maybe constructed of fabric, comprise a fabric layer, or otherwise be constructed of a material that facilitates secure sewing of the flexible substrate 14 to a flexible object 16 (e.g., that is constructed of a fabric, leather, canvas, etc.).

As schematically represented in FIG. 1, the housing 18 maybe described as defining a central axis 19, such as that passes through the center of volume of the housing 18 and through the flexible substrate 14. Accordingly, the housing 18 maybe described as having a greatest lateral housing dimension 21 that is transverse, or perpendicular, to the central axis 19; and the flexible substrate 14 maybe described as having a greatest lateral substrate dimension 23 that is transverse, or perpendicular, to the central axis 19. As schematically represented in FIG. 1, the greatest lateral substrate dimension 23 is greater than the greatest lateral housing dimension 21. In other words, the flexible substrate 14 extends away from the housing 18. As a result, the flexible substrate 14 provides an operative surface area for operative attachment to a flexible object 16. In some examples, the housing 18 is centered relative to the flexible substrate 14, although this is not required in all examples, such as depending on the specific desired location for installation of a mount 10 on a flexible object 16.

The flexible substrate 14 maybe coupled to the housing 18 in a variety manners, such that the housing 18 does not detrimentally detach from the flexible substrate 14 at least when the flexible substrate 14 is operatively coupled to a flexible object 16. In other words, the operative coupling of the flexible substrate 14 to a flexible object 16 also operatively secures the housing 18 (and any device 12 held therein) to the flexible object 16. In some examples, as schematically represented in FIG. 1, the flexible substrate 14 defines an aperture 30, and the housing 18 extends through the aperture 30. In some such examples and as schematically represented in FIG. 1, the housing 18 comprises a body 32 and a flange 34 that extends from the body 32. As schematically represented in FIG. 1, the body 32 extends through the aperture 30, and the flange 34 engages the second side 38 of the flexible substrate 14. In some examples, the flange 34 extends fully around the body 32, while in other examples, the flange 34 may comprise a plurality of flange tabs 40 that are spaced-apart around the body 32. Functionally, the flange 34 restricts the body 32 from passing completely through the aperture 30 of the flexible substrate 14. That is, the flange 34 has a maximum lateral dimension 42 that is greater than a maximum lateral dimension 62 of the aperture 30.

In some examples, the flange 34 is adhered to the second side 38 of the flexible substrate 14. In some examples, the flange 34 is heat-sealed to the second side 38 of the flexible substrate 14. In some examples, the flange 34 is welded to the second side 38 of the flexible substrate 14.

In some examples, both the flange 34 and the body 32 are secured to the flexible substrate 14. For example, as schematically and optionally represented in FIG. 1, the body 32 may extend beyond the aperture 30, such that the flexible substrate 14 extends and is secured between (e.g., is sandwiched between) the body 32 and the flange 34. In some examples, the body 32 is welded to the first side 36 of the flexible substrate 14 opposite the flange 34. In some examples, the flange 34 is welded to the second side 38 of the flexible substrate 14.

In some examples, the flange 34 and the body 32 are monolithic. That is, they may be molded or otherwise constructed as a unitary, single piece of material. In other examples, the flange 34 and the body 32 maybe distinct structures that are coupled together. For example, the flange 34 maybe welded to the body 32. In some examples, the flange 34 is welded to the body 32 with the flexible substrate 14 secured between the flange 34 and the body 32.

In other examples, the flange 34 is not adhered or otherwise secured to the flexible substrate 14, and the housing 18 is operatively retained with the flexible substrate 14 only when the flexible substrate 14 is operatively coupled to a flexible object 16, with the flange 34 restricting the housing 18 from being removed from through the aperture 30.

With continued reference to FIG. 1, in some examples, the housing 18 further comprises a cover 44 that is removably coupled to the body 32 to permit for placement and removal of the device 12 in and from the internal void 20. That said, a cover 44 is not required in all examples, and the housing 18 maybe configured to operatively retain a device 12 within the internal void 20 without the need of a cover 44.

When present, the cover 44 maybe operatively and removably coupled to the body 32 using one or more of a variety of mechanisms. For example, the cover 44 maybe threadingly coupled to the body 32. In other examples, the cover 44 has a snap-fit with the body 32. Additionally or alternatively, the cover 44 maybe flexible and have a stretch fit with the body 32. For example, the cover 44 maybe constructed of rubber, silicone, or other stretchable material. In some examples, as schematically represented in FIG. 1, the cover 44 comprises a lip 64 that extends toward the central axis 19, and the body 32 defines a channel 66 that is configured to mate with the lip 64 to operatively retain the cover 44 on the body 32. In such examples, in which the cover 44 is flexible and has a stretch-fit with the body 32, a user stretches the cover 44 to release the lip 64 from the channel 66 to remove the cover 44, and stretches the cover 44 to mate the lip 64 with the channel 66 to attach the cover 44.

In some examples, the body 32 is constructed of a material that is more rigid than a material from which the cover 44 is constructed.

In some examples, the cover 44 is hinged to the body 32.

In some examples, as schematically represented in FIG. 1, the cover 44 comprises a cover tab 48 that is sized to be engaged by a user's finger for operative removal of the cover 44 from the body 32. For example, in examples in which the cover 44 is constructed of a stretchable material and has a stretch-fit with the body 32, a user engages the cover tab 48 adjacent to the flexible substrate 14 and pulls the cover tab 48, and thus the cover 44, away from the flexible substrate 14. In examples in which the cover 44 comprises a lip 64, the pulling of the cover tab 48 causes the lip 64 to unseat, or unmate, from the channel 66.

With continued reference to FIG. 1, the housing 18 of some examples of mounts 10 defines a window 46 through which a device 12 maybe seen when the device 12 is operably received in the internal void 20. Accordingly, in such examples, a user can readily determine if a device 12 is present within the housing without removing the cover 44. In some such examples, as schematically represented in FIG. 1, the window 46 is positioned on a lateral side 50 of the body 32 of the housing 18, such as adjacent the flexible substrate 14. In some examples, the cover 44 also may define the window 46. Alternatively, in some examples, only the cover 44 comprises a window 46 for visually identifying the presence of a device 12 within the housing 18.

In some examples and as schematically and optionally represented in FIG. 1, the body 32 of the housing 18 defines a passage 49, and the body 32 is configured to stretch to permit selective placement of the device 12 through the passage 49 and into the internal void 20, such that the body 32 retains the device 12 within the internal void 20. For example, the body 32 maybe constructed of rubber, silicone, or other stretchable material, so that the body 32 and the passage 49 are deformed when a device 12 is inserted through the passage 49 and then are biased back to a nominal configuration once the device 12 is operably received within the internal void 20. In other words, a profile of the passage 49 maybe smaller than a profile of the device 12. In some examples of mounts 10 that have a passage 49, the housing 18 does not comprise a cover 44, although in other examples, a cover 44 is included.

In some examples of mounts 10, the housing 18 is configured to receive a device 12 in the internal void 20 in a friction-fit arrangement or a snap-fit arrangement. In some such examples and as schematically represented in FIG. 1, the internal void 20 comprises a body-portion 54 that is defined by the body 32, and the body 32 comprises a terminal lip 56. In some such examples, the internal void 20 may extend beyond the terminal lip 56, such as with an optional cover 44 also defining a portion of the internal void 20. The body-portion 54 of the internal void 20 maybe described as having a maximum body-portion dimension 58, while the terminal lip 56 defines an inside lip-dimension 60 that is less than the maximum body-portion dimension 58. In such examples, the body 32 and in particular, the terminal lip 56 maybe constructed of a rigid but resilient material, such as a plastic, that deforms when a device 12 is pushed past the terminal lip 56 and returns toward a nominal configuration to retain the device 12 in a friction-fit or snap-fit arrangement. Such embodiments may or may not include an optional cover 44. When provided, the optional cover 44 acts as a secondary mechanism to ensure that the device 12 is not inadvertently knocked or bumped out of the internal void 20, such as a result of a force that otherwise would overcome the friction-fit or snap-fit arrangement between the device 12 and the body 32.

With continued reference to FIG. 1, in some examples of mounts 10, the body 32 of the housing 18 defines an opening 52 that is sized to restrict passage of the device 12 through the opening 52, and sized to permit a user's finger (and/or at least a portion of the flexible object 16) to extend through the opening 52, to the device 12 within the internal void 20, to urge the device 12 out of the internal void 20 opposite the opening 52. That is, unlike the optional passage 49, described above, the optional opening 52 is configured to prevent a device 12 from passing through the opening 52. In some examples, the opening 52, while defined by the body 32, also extends through the flexible substrate 14. In examples where the housing 18 is configured to receive a device 12 in the internal void 20 in a friction-fit arrangement or a snap-fit arrangement, the optional opening 52 provides a way for a user to release the device from the friction-fit or snap-fit arrangement, such as by pushing on the device through the opening 52 to overcome the friction between the device 12 and the terminal lip 56. If the mount 10 is operatively coupled to a flexible object 16, the user urges the portion of the flexible object 16 that overlays the opening 52 into the opening 52 to engage the device 12 for removal thereof.

Turning now to FIGS. 2-13, illustrative, non-exclusive examples of mounts 10 in the form of a mount 100 (FIGS. 2-7) and a mount 200 (FIGS. 8-13) are illustrated. Where appropriate, the reference numerals from the schematic illustration of FIG. 1 are used to designate corresponding parts of mount 100 and mount 200; however, the examples of FIGS. 2-13 are non-exclusive and do not limit mounts 10 to the illustrated embodiments of mount 100 and mount 200. That is, mounts 10 are not limited to the specific embodiments of the illustrated mount 100 and mount 200, and mounts 10 may incorporate any number of the various aspects, configurations, characteristics, properties, etc. of mounts 10 that are illustrated in and discussed with reference to the schematic representations of FIG. 1 and/or the embodiments of FIGS. 2-13, as well as variations thereof, without requiring the inclusion of all such aspects, configurations, characteristics, properties, etc. For the purpose of brevity, each previously discussed component, part, portion, aspect, region, etc., or variants thereof may not be discussed, illustrated, and/or labeled again with respect to mount 100 and mount 200; however, it is within the scope of the present disclosure that the previously discussed features, variants, etc. may be utilized with mount 100 and mount 200.

With reference to FIGS. 2-7, mount 100 is an example of a mount 10 whose flexible substrate 14 comprises an adhesive-backed film 22 and whose housing 18 comprises a body 32, a flange 34 that extends from the body 32, and a cover 44 that is removably coupled to the body 32. In particular, the cover 44 is constructed of a stretchable material and is an example of a cover 44 that comprises a lip 64 that extends into a channel 66 defined by the body 32, as seen in cross-section in FIG. 7. As also best seen in FIG. 7, mount 100 is an example of a mount 10 whose flexible substrate 14 extends and is secured between the body 32 and the flange 34. In addition, in mount 100, the body 32 and the flange 34 are sonically welded together at an interface adjacent to the flexible substrate 14. As also perhaps best seen in FIG. 7, the body 32 comprises a terminal lip 56, such that a device 12 is received within the housing 18 in a snap-fit arrangement. In addition, the body 32 of mount 100 defines an opening 52 to permit a user to engage a device 12 within the housing 18 and urge the device out of the friction-fit arrangement when the cover 44 has been removed.

Turning now to FIGS. 8-13, mount 200 is an example of a mount 10 whose flexible substrate 14 comprises an adhesive-backed film 22 and whose housing 18 comprises a body 32 and flange 34 that are monolithic and constructed of a stretchable material. The body 32 of mount 200 defines a passage 49 to permit stretching of the body 32 for selective placement of a device 12 within the internal void 20. The flange 34 of mount 200 is adhered to the second side 38 of the flexible substrate 14 via the adhesive layer of the adhesive-backed film 22 and restricts removable of the housing 18 through the aperture 30 of the flexible substrate 14. The housing 18 of mount 200 also defines an opening 52 to permit a user to push a device 12 through the passage 49 for removal of the device 12 from the internal void 20.

Illustrative, non-exclusive examples of inventive subject matter according to the present disclosure are described in the following enumerated paragraphs:

A. A mount (10) for securing a device (12) to a flexible object (16), the mount (10) comprising:
   a flexible substrate (14) configured to be operatively coupled to the flexible object (16); and
   a housing (18) coupled to the flexible substrate (14) and having an internal void (20) that is sized to receive the device (12).

A1. The mount (10) of paragraph A, wherein the flexible substrate (14) comprises an adhesive-backed film (22) comprising a base layer (24), an adhesive (26) adhered to the base layer (24), and a removable backing (28) removably adhered to the adhesive (26).

A2. The mount (10) of any of paragraphs A-A1, wherein the flexible substrate (14) is configured to be sewn to the flexible object (16).

A3. The mount (10) of any of paragraphs A-A2, wherein the housing (18) defines a central axis (19), wherein the housing (18) has a greatest lateral housing dimension (21) transverse to the central axis (19), wherein the flexible substrate (14) has a greatest lateral substrate dimension (23) transverse to the central axis (19), and wherein the greatest lateral substrate dimension (23) is greater than the greatest lateral housing dimension (21).

A3.1. The mount (10) of paragraph A3, wherein the housing (18) is centered relative to the flexible substrate (14).

A4. The mount (10) of any of paragraphs A-A3.1, wherein the flexible substrate (14) defines an aperture (30), and wherein the housing (18) extends through the aperture (30).

A4.1. The mount (10) of paragraph A4, wherein the housing (18) comprises a body (32) and a flange (34) extending from the body (32), wherein the flexible substrate (14) has a first side (36) and a second side (38) opposite the first side (36), wherein the body (32) extends through the aperture (30), and wherein the flange (34) engages the second side (38) of the flexible substrate (14).

A4.1.1. The mount (10) of paragraph A4.1, wherein the flange (34) extends fully around the body (32).

A4.1.2. The mount (10) of paragraph A4.1, wherein the flange (34) comprises a plurality of flange tabs (40) spaced-apart around the body (32).

A4.1.3. The mount (10) of any of paragraphs A4.1-A4.1.2, wherein the flange (34) is adhered to the second side (38) of the flexible substrate (14).

A4.1.4. The mount (10) of any of paragraphs A4.1-A4.1.3, wherein the flange (34) is heat-sealed to the second side (38) of the flexible substrate (14).

A4.1.5. The mount (10) of any of paragraphs A4.1-A4.1.4, wherein the flange (34) is welded to the second side (38) of the flexible substrate (14).

A4.1.6. The mount (10) of any of paragraphs A4.1-A4.1.5, wherein the body (32) is welded to the first side (36) of the flexible substrate (14) opposite the flange (34).

A4.1.7. The mount (10) of any of paragraphs A4.1-A4.1.6, wherein the flexible substrate (14) is secured between the body (32) and the flange (34).

A4.1.8. The mount (10) of any of paragraphs A4.1-A4.1.2, wherein the flange (34) is not adhered to the flexible substrate (14).

A4.1.9. The mount (10) of any of paragraphs A4.1-A4.1.8, wherein the flange (34) and the body (32) are monolithic.

A4.1.10. The mount (10) of any of paragraphs A4.1-A4.1.8, wherein the flange (34) is coupled to the body (32).

A4.1.10.1. The mount (10) of paragraph A4.1.10, wherein the flange (34) is welded to the body (32).

A4.1.10.1.1. The mount (10) of paragraph A4.1.10.1, wherein the flange (34) is welded to the body (32) with the flexible substrate (14) secured between the flange (34) and the body (32).

A5. The mount (10) of any of paragraphs A-A4.1.10.1.1, wherein the housing (18) comprises a/the body (32) and a cover (44) removably coupled to the body (32) to permit for placement and removal of the device (12) in and from the internal void (20).

A5.1. The mount (10) of paragraph A5, wherein the cover (44) is threadingly coupled to the body (32).

A5.2. The mount (10) of paragraph A5, wherein the cover (44) has a snap-fit with the body (32).

A5.3. The mount (10) of paragraph A5, wherein the cover (44) is flexible and has a stretch-fit with the body (32).

A5.3.1. The mount (10) of paragraph A5.3, wherein the body (32) is more rigid than the cover (44).

A5.4. The mount (10) of paragraph A5, wherein the cover (44) is hinged to the body (32).

A5.5. The mount (10) of any of paragraphs A5.2-A5.4, wherein the cover (44) comprises a cover tab (48) that is sized to be engaged by a user's finger for operative removal of the cover (44) from the body (32).

A5.6. The mount (10) of any of paragraphs A5.2-A5.5, wherein the housing (18) defines a/the central axis (19), wherein the cover (44) comprises a lip (64) extending toward the central axis (19), and wherein the body (32) defines a channel (66) configured to mate with the lip (64) to operatively retain the cover (44) on the body (32).

A6. The mount (10) of any of paragraphs A-A5.6, wherein the housing (18) defines a window (46) through which the device (12) may be seen when the device (12) is operably received in the internal void (20).

A6.1. The mount (10) of paragraph A6, wherein the window (46) is positioned on a lateral side (50) of the housing (18).

A7. The mount (10) of any of paragraphs A-A6.1, wherein the housing (18) comprises a/the body (32), wherein the body (32) defines a passage (49), and wherein the body (32) is configured to stretch to permit for selective placement of the device (12) through the passage (49) and into the internal void (20), such that the body (32) retains the device (12) within the internal void (20).

A8. The mount (10) of any of paragraphs A-A7, wherein the housing (18) comprises a/the body (32), and wherein the body (32) defines an opening (52) sized to restrict passage of the device (12) through the opening (52), and sized to permit a/the user's finger to extend through the opening (52), to engage the device (12) within the internal void (20), to urge the device (12) out of the internal void (20) opposite the opening (52).

A8.1. The mount (10) of paragraph A8, wherein the opening (52) extends through the flexible substrate (14).

A9. The mount (10) of any of paragraphs A-A8.1, wherein the housing (18) is configured to receive the device (12) in the internal void (20) in a friction-fit arrangement or a snap-fit arrangement.

A9.1. The mount (10) of paragraph A9, wherein the housing 18 comprises a/the body (32), wherein the internal void (20) comprises a body-portion (54) defined by the body (32), wherein the body (32) comprises a terminal lip (56), wherein the body-portion (54) of the internal void (20) has a maximum body-portion dimension (58), and wherein the terminal lip (56) defines an inside lip-dimension (60) that is less than the maximum body-portion dimension (58).

A10. The mount (10) of any of paragraphs A-A9.1, wherein the device (12) is a tracking device.

A11. The mount (10) of any of paragraphs A-A10, wherein the flexible object (16) is an article of clothing or a bag.

A12. The mount (10) of any of paragraphs A-A11 in combination with the device (12).

A12.1. The combination of paragraph A12, wherein the device (12) is positioned within the internal void (20).

A13. The mount (10) or combination of any of paragraphs A-A12.1 in combination with the flexible object (16).

A14. An assembly (300), comprising:
the mount (10) of any of paragraphs A-A11; and
the flexible object (16), wherein the mount (10) is operatively coupled to the flexible object (16).

A15. The assembly (300) of paragraph A14, further comprising the device (12) positioned within the internal void (20) of the housing (18).

As used herein, the terms "selective" and "selectively," when modifying an action, movement, configuration, or other activity of one or more components or characteristics of an apparatus, mean that the specific action, movement, configuration, or other activity is a direct or indirect result of user manipulation of an aspect of, or one or more components of, the apparatus.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function.

As used herein, the term "and/or" placed between a first entity and a second entity means one of (1) the first entity, (2) the second entity, and (3) the first entity and the second entity. Multiple entries listed with "and/or" should be construed in the same manner, i.e., "one or more" of the entities so conjoined. Other entities optionally may be present other than the entities specifically identified by the "and/or" clause, whether related or unrelated to those entities specifically identified. Thus, as a non-limiting example, a reference to "A and/or B," when used in conjunction with open-ended language such as "comprising," may refer, in one example, to A only (optionally including entities other than B); in another example, to B only (optionally including entities other than A); in yet another example, to both A and B (optionally including other entities). These entities may refer to elements, actions, structures, steps, operations, values, and the like.

The various disclosed elements of apparatuses and steps of methods disclosed herein are not required to all apparatuses and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus or method. Accordingly, such inventive subject matter is not required to be associated with the specific apparatuses and methods that are expressly disclosed herein, and such inventive subject matter may find utility in apparatuses and/or methods that are not expressly disclosed herein.

The invention claimed is:

1. A mount (10) for securing a tracking device (12) to a flexible object (16), the mount (10) comprising:
   a flexible sheet material (14) configured to be operatively coupled to the flexible object (16), wherein the flexible sheet material (14) is configured to conform to the flexible object (16); and
   a housing (18) coupled to the flexible sheet material (14) and having an internal void (20) that is sized to receive the tracking device (12), wherein the flexible sheet material (14) extends laterally away from the housing (18);
   wherein the housing (18) defines a central axis (19), wherein the housing (18) has a greatest lateral housing dimension (21) transverse to the central axis (19), wherein the flexible sheet material (14) has a greatest lateral substrate dimension (23) transverse to the central axis (19), and wherein the greatest lateral substrate dimension (23) is greater than the greatest lateral housing dimension (21).

2. The mount (10) of claim 1, wherein the flexible sheet material (14) comprises an adhesive-backed film (22) comprising a base layer (24), an adhesive (26) adhered to the base layer (24), and a removable backing (28) removably adhered to the adhesive (26).

3. The mount (10) of claim 1, wherein the flexible sheet material (14) is configured to be sewn to the flexible object (16).

4. The mount (10) of claim 1, wherein the housing (18) is centered relative to the flexible sheet material (14).

5. The mount (10) of claim 1, wherein the flexible sheet material (14) defines an aperture (30), and wherein the housing (18) extends through the aperture (30).

6. The mount (10) of claim 5, wherein the housing (18) comprises a body (32) and a flange (34) extending from the body (32), wherein the flexible sheet material (14) has a first side (36) and a second side (38) opposite the first side (36), wherein the body (32) extends through the aperture (30), and wherein the flange (34) engages the second side (38) of the flexible sheet material (14).

7. The mount (10) of claim 6, wherein the flange (34) extends fully around the body (32).

8. The mount (10) of claim 6, wherein the flexible sheet material (14) is secured between the body (32) and the flange (34).

9. The mount (10) of claim 6, wherein the flange (34) and the body (32) are monolithic.

10. The mount (10) of claim 6, wherein the flange (34) is coupled to the body (32).

11. The mount (10) of claim 1, wherein the housing (18) comprises a body (32) and a cover (44) removably coupled to the body (32) to permit for placement and removal of the tracking device (12) in and from the internal void (20).

12. The mount (10) of claim 11, wherein the cover (44) is flexible and has a stretch-fit arrangement with the body (32).

13. The mount (10) of claim 12, wherein the cover (44) comprises a cover tab (48) that is sized to be engaged by a finger of a user for operative removal of the cover (44) from the body (32).

14. The mount (10) of claim 12, wherein the cover (44) comprises a lip (64) extending toward the central axis (19), and wherein the body (32) defines a channel (66) configured to mate with the lip (64) to operatively retain the cover (44) on the body (32).

15. The mount (10) of claim 1, wherein the housing (18) comprises a body (32), wherein the body (32) defines a passage (49), and wherein the body (32) is configured to stretch to permit for selective placement of the tracking device (12) through the passage (49) and into the internal void (20), such that the body (32) retains the tracking device (12) within the internal void (20).

16. The mount (10) of claim 1, wherein the housing (18) comprises a body (32), and wherein the body (32) defines an opening (52) sized to restrict passage of the tracking device (12) through the opening (52), and sized to permit a finger of a user to extend through the opening (52), to engage the tracking device (12) within the internal void (20), to urge the tracking device (12) out of the internal void (20) opposite the opening (52).

17. The mount (10) of claim 1, wherein the housing (18) is configured to receive the tracking device (12) in the internal void (20) in a friction-fit arrangement or a snap-fit arrangement.

18. The mount (10) of claim 17, wherein the housing (18) comprises a body (32), wherein the internal void (20) comprises a body-portion (54) defined by the body (32), wherein the body (32) comprises a terminal lip (56), wherein the body-portion (54) of the internal void (20) has a maximum body-portion dimension (58), and wherein the terminal lip (56) defines an inside lip-dimension (60) that is less than the maximum body-portion dimension (58).

19. The mount (10) of claim 1, wherein the internal void (20) is configured to receive the tracking device (12) wholly on one side of the flexible sheet material (14).

20. An assembly (300), comprising:
the mount (10) of claim 1;
the tracking device (12), wherein the tracking device (12) is positioned within the internal void (20) of the housing (18); and
the flexible object (16), wherein the mount (10) is operatively coupled to the flexible object (16).

\* \* \* \* \*